Feb. 9, 1965 R. L. JOHNSTON ETAL 3,169,063

METHOD OF MAKING PRINTED CIRCUITS

Filed June 29, 1961 2 Sheets-Sheet 1

INVENTORS.
ROBERT L. JOHNSTON
WILBUR E. HESS

BY Frank H. Cullen
ATTORNEY

INVENTORS.
ROBERT L. JOHNSTON
WILBUR E. HESS
BY Frank H. Cullen
ATTORNEY

United States Patent Office 3,169,063

Patented Feb. 9, 1965

3,169,063

METHOD OF MAKING PRINTED CIRCUITS

Robert L. Johnston, Exton, and Wilbur E. Hess, Broomall, Pa., assignors to Burroughs Corporation, Detroit, Mich., a corporation of Michigan Filed June 29, 1961, Ser. No. 120,669
4 Claims. (Cl. 96—27)

This invention relates to the method of making printed circuit boards, but more particularly it has to do with the making of close tolerance art work for printed circuit boards having circuitry on both sides, and whereby precise registration of and interconnection between the circuitry on the opposite sides may be obtained.

Various methods have been used in making such printed circuit boards, the more popular of which include the laying out of each line and pad by hand or by machines from a common reference point. Such methods are not only costly, requiring expensive equipment and highly skilled help, but are prone to error. Furthermore, the exact registration of desired points on both sides of the printed circuit board has proved difficult to achieve since the two sides are made independently.

It is the primary object of this invention to provide a precision method for making printed circuit boards.

Another object is to provide a method for making close tolerance printed circuit art work for two-sided printed circuit boards affording precision of registration between the two sides, and whereby the circuitry may easily and accurately be interconnected.

A further object of this invention is to provide such a method whereby registration between circuits on opposite sides of a board may be achieved economically by the use of unskilled help and inexpensive equipment.

According to the above and first briefly described, the method in accordance with the invention comprises the formation of an enlarged grid master, the application of opaque pads and tape on the grid master according to the circuitry desired for opposite sides of the printed circuit board, and all on an enlarged scale. First the pads are placed at grid points where it is desired to interconnect circuitry on one side of the board with circuitry on the other side, and where components are to be mounted. Tape in accordance with the circuits for the one side are then applied to the grid master. This grid master now containing the desired circuit configuration—in pads and tape—for the said one side is then photographically reproduced on film, reduced to the desired board size, thus to provide a photo negative of this one side. The circuitry tapes are then removed, leaving the pads undisturbed, and new tapes to form the circuit lines for the opposite side of the board are applied. The grid master of this second side is then photographically reproduced on film, reduced—as was the first side—to the desired board size, thus to provide a photo negative of this opposite side. The two negatives, used as photographic models or light masks, are then registered with and photo-printed on opposite photosensitized sides of a prepared printed circuit board blank, after which the board is plated, etched and cleaned in the usual manner to completion.

The various features and advantages of the invention will appear more clearly from the following detailed description of the preferred form when considered with the drawings, in which.

Figure 1:
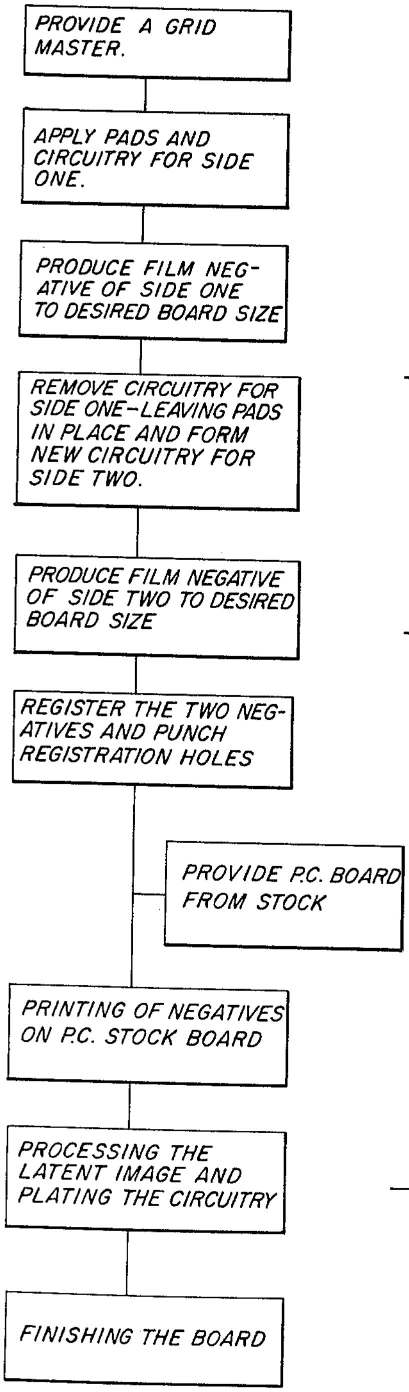
FIG. 1 is a flow diagram of the various steps of the invention leading to the production of a finished printed circuit board.
Figure 2:
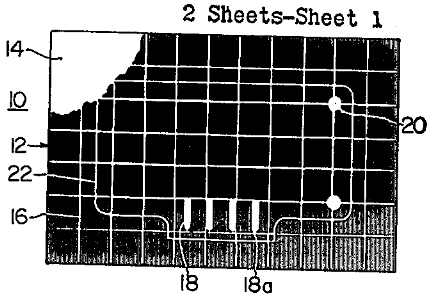
FIG. 2 is a plan view of a grid master negative.

Now with reference to the details of the drawings illustrating the preferred embodiment of the invention, and first with reference to FIG. 2, it is seen that a large grid master negative 10 is formed by scribing through an opaque film 12 coated on a transparent panel 14, such as glass. This grid master is purposely made of rather large dimensions—say, for example, four times the desired finished board size—so that a reduction step is necessary to obtain the finished board in the desired size. The reduction step is desired so that errors—if any—made in laying out the grid master positive—reproduced from the negative, as described below—will be reduced in the same proportion that the master is reduced. The grid master negative 10, in addition to having a grid 16 scribed through the film 12, also has other features similarly scribed through the film, all of which are to appear on all of the boards made from this particular master negative. These other features include such things as edge contact pads 18, common mounting holes 20, and the board profile or outline 22.

The next step after the grid master negative has been scribed is to reproduce it on a transparent film base 24 (FIG. 3) by a contact printing step resulting in an exact size positive replica 26 of the grid master negative 10, hereinafter referred to as the grid master positive, or just positive. During the development of this positive, the grid lines and other features are etched into its surface by suitable chemicals, such as a bleach. The etched grid lines 16a on this positive are then dyed blue. The color blue is chosen because it will not reproduce in the next photographic step. The other features which are reproduced on the positive are dyed another color, such as red, so that they will reproduce in the next photographic step.

Figure 3:
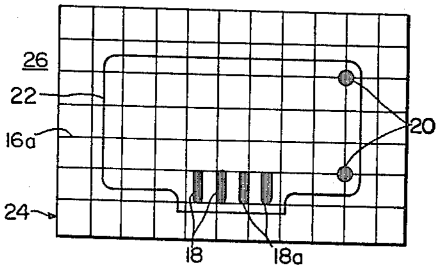
FIG. 3 is a plan view of a grid master positive reproduced from the negative shown in FIG. 2.
Figure 4:
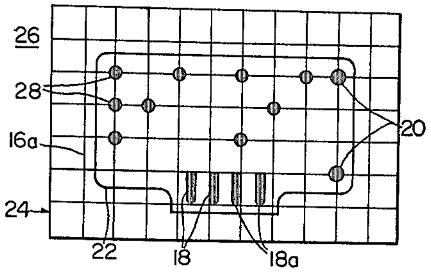
FIG. 4 is a plan view of the grid master positive showing circuit pads placed at selected grid intersections.
Figure 5:
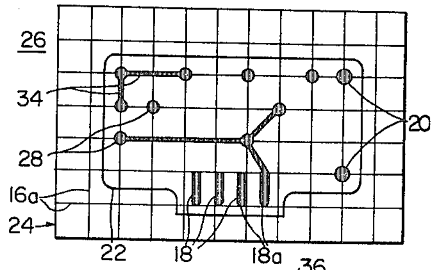
FIG. 5 is similar to FIG. 4 but further shows circuit tapes applied in accordance with the desired circuit layout for one side of the printed circuit board.
Figure 16:
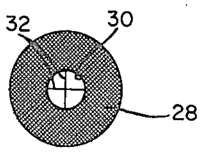
FIG. 16 is a plan view showing details of the pads.

Using this replica, as seen in FIG. 3, opaque pads 28 are removably secured at desired intersections of the grid lines, see FIG. 4. To facilitate their placement, and as seen in FIG. 16, the pads are provided with a small center opening 30 having crosshairs 32 therein for registration with grid line intersections. The grid lines are then employed as guides for the placing of opaque circuit tape 34, as shown in FIG. 5, interconnecting the desired pads. Both the pads 28 and tape 34 have a coating on one side of pressure-sensitive adhesive to facilitate ease of application and removal.

The resulting configuration after the placing of the pads and tape at the desired circuitry positions on the first, or side 1, of the printed circuit board, is illustrated in FIG. 5. However, as was explained above, this may be a number of times the desired board size, therefore a reduction is necessary to make it usable for reproduction on the board. The necessary reduction is accomplished by photo-projection printing of the grid master positive which now contains the desired circuitry for side 1. In projection printing a lens is used to project the image on a sheet of sensitized film. The size of the projected image is dependent upon the distance from the lens to the sensitized film, the size of the negative, and the focal length of the lens. In this case the positioning is such as to produce a negative 33 (FIG. 8) having the circuitry and other features of side 1 reduced to the desired size of the finished board.

Figure 6:
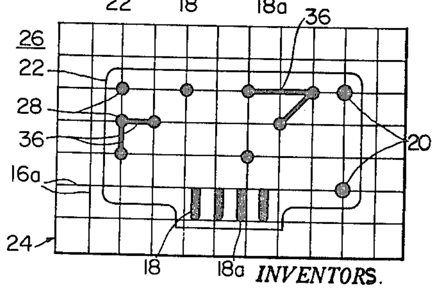
FIG. 6 is similar to FIG. 5 but illustrates the desired circuit layout for the other side of the printed circuit board.

The circuit tapes 34 for side 1 are then removed leaving the pads 28 in place. New tapes 36 which will represent the desired circuits for the opposite or side 2 of the board are now applied to the grid master positive, as seen in FIG. 6. This new arrangement is then photographically reproduced in reduced size precisely the same amount as side 1 that is, to the desired board size, thus to provide a negative 37 (FIG. 8) representative of side 2 of the printed circuit board.

The blue grid lines do not appear on the resultant negatives of either side, but the lines and areas dyed red are reproduced along with the circuitry represented by the pads and tape. These other features which are dyed red may also be formed with pressure-sensitive tape or preformed pads, but because they are common to both sides it is preferred to etch and dye them, as described. While, because of drawing limitations, only a few circuit lines have been shown for each side of the board, it will be understood that many printed circuit boards have numerous, closely spaced circuit lines, and it is in connection with such boards that the advantages of the present invention become more apparent.

Figure 7:
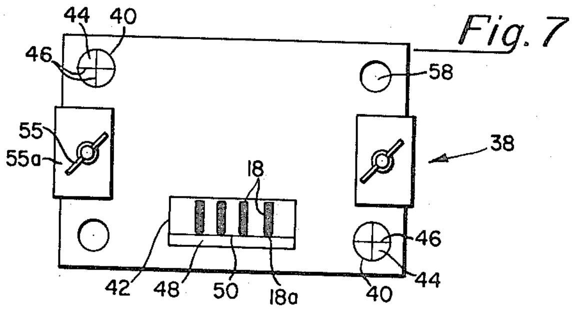
FIG. 7 is a plan view of a jig wherein negatives are aligned and registration holes punched.
Figure 8:
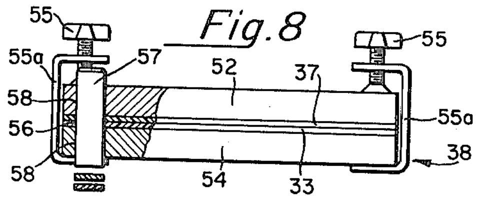
FIG. 8 is an elevational or end view of the jig shown in FIG. 7.

The negatives are now registered with each other by aligning at least two points common on each. Two such points may be, for example, the lower extremities 18*a* of the contact pads 18 and a common pad 28, or alternatively, two pads 28 at opposite sides or corners. In practice it has been found effective to provide or reproduce crosshairs on the negatives outside of the board outline and at diagonally opposite corners. The farther apart the alignment points are, the more accurate is the registration. After the negatives are registered they are suitably secured together to avoid any misalignment, and then placed in a jig 38, as shown in FIGS. 7 and 8, which has a number of circular apertures 40 therein, two in this case, and one rectangular aperture 42. While other registering devices may be used, in this form of the invention the circular apertures are fitted with transparent windows 44 having crosshairs 46 scribed thereon, and the rectangular opening 42 is fitted with a transparent window 48 having a straight hair-line 50 scribed thereon.

The registered negatives 33 and 37 are slipped into the jig 38 between its top and bottom plates 52 and 54 respectively, under the windows 44 and 48 with the bottom extremity 18*a* of the contact pads 18 aligned on hair-line 50, as shown in FIG. 7, and at least one but preferably two other points, such as pads 28—or the above-mentioned crosshairs on the negatives—located in the upper left hand and lower right hand corners, centered on the scribed crosshairs 46 in windows 44. The jig plates are tightly drawn together, as by thumb-screws 55 and C-shaped brackets 55*a*, thus to hold the negatives against shifting. Following this jig alignment, registration holes 56 are punched through the registered negatives by passing a punch 57 through punch-holes 58 provided in the jig plates 52 and 54.

Figure 9:
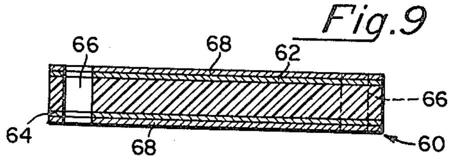
FIG. 9 is a fragmentary sectional view showing a board having a registration hole therethrough and coated or laminated with a metallic film, such as copper foil, which has in turn been coated with a photo-resist.

A printed circuit stock board 60 (FIG. 9) of suitable dielectric material, such as epoxy or phenolic, having a thin layer of metal such as copper foil, aluminum, or other suitable electrically conductive material, secured to or coated on both of its surfaces, as indicated at 62 and 64, and a pair of registration holes 66 punched or otherwise formed through it (only one being shown in this figure) in positions corresponding to the registration holes 56 in the negatives, now has the metallic surfaces thereof photosensitized by being coated with a known photoengravers' resist 68.

If desired, the board may be precoated with the resist but this poses storage problems to prevent exposure to light, so it is preferred to apply the resist just prior to use.

Figure 10:
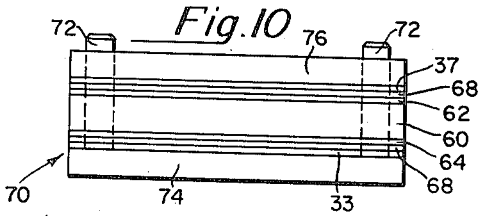
FIG. 10 is a side elevational view of a printing fixture partially broken away, and showing the negatives and a printed circuit board mounted thereon ready for printing.

The printing fixture 70, shown in FIG. 10, consists of two studs or pins 72 mounted on a transparent base 74 the same distance apart and in positions corresponding to the registration holes 56 and 66 in the negatives and board respectively. The negative 33 of side 1 is now mounted on the transparent base with the pins 72 extending through the registration holes 56, following which the board 60 is similarly mounted with its photosensitized surface 68 against the negative. As shown in FIG. 10, both sides may be printed simultaneously by now placing the negative 37 over the pins 72 and against the other side of the board, and then putting a second transparent base member 76 on the pins 72, clamping the assembly together and exposing both sides to light through the transparent base members. Each side may, if desired, be exposed simultaneously or individually and consecutively. In the latter case two printing fixtures are used, a different one for each negative. The pins are similarly placed on the fixtures, but at opposite hand. With the two fixtures side by side and each with its corresponding negative thereon, after exposing one side the board is removed from one fixture, turned over 180° such as a page in a book, and mounted on the other fixture thereby automatically registering the circuitry on side one with that on side two.

From the above it is now understood that the invention as so far described provides a new method of close tolerance art work effective for the making of printed circuit boards and particularly those having circuitry on both sides, portions of which are to be interconnected through the board. It is understood that the word "negative" as used in the above printing operation may be either the positive or negative transparency, in an appropriate printing process, through which the photosensitized foil-cover base is exposed to light, as is well-known in the art.

From this point to the completion of the board, as described below, the method is conventional following one sequence of steps known in the art, it being understood that other equivalents may be used. It should be understood, however, that the above-described new steps when combined with the conventional steps now to be described, comprise a new combination of method steps effective to produce a two-sided printed circuit board with precise registration of the circuits on its opposite sides.

Figure 11:
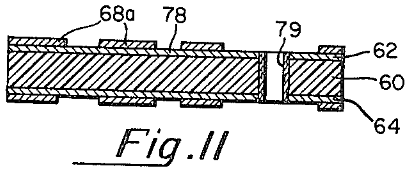
FIG. 11 is a fragmentary sectional view of the printed circuit board of FIG. 10 after the printing and developing operations and showing a hole drilled through aligned pad locations on opposite sides of a board and its walls coated with a metallic paint.

In accordance with this known procedure, the printed board is next subjected to the usual chemical steps of developing and fixing, after which the board, as seen in FIG. 11, will have exposed copper surfaces 78 corresponding to the pattern printed from the negatives, including the desired circuit layout, and photo-resist on the other surfaces, as designated by the numeral 68*a* on the remaining areas.

In order to provide the interconnection of circuitry on one side with circuitry on the other by the most effective method, that is, by plated-through holes, the board may most conveniently be drilled at this point in the method. It is for this purpose that the pads are provided. We know now that the pads on opposite sides are aligned, with the center of each defined by cross-hairs affording a center guide for the drilling. Where interconnection is desired the walls of the holes are coated with a conductive film, such as a metallic paint 79 (FIG. 11) upon which metal will be deposited in the step in the method next described. The mounting holes 20 may also be drilled at this time, or later if desired.

Figure 12:
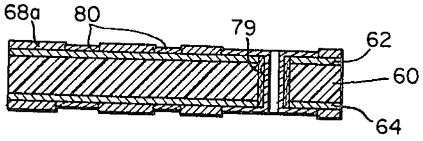
FIG. 12 is a fragmentary sectional view of the developed printed circuit board after the plating operation, and showing the hole plated through thus to interconnect circuitry on opposite sides of the board.
Figure 13:
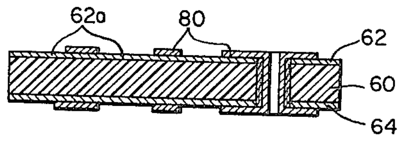
FIG. 13 is a fragmentary sectional view of the plated board with the photo-resist removed.

The board is now subjected to a plating operation, which may be carried out by means of conventional plating methods and apparatus. The developed photo-resist 68*a* which has not as yet been removed, acts as a resist to the plating. The result of this operation is that the bare copper areas 78 and the coated holes will now be plated, as seen in FIG. 12, preferably with one of the noble metals, such as gold, rhodium, or other metal 80. The plating on the areas 78 serves as a resist in a following etching step.

The remaining photo-resist 68*a* is now removed by any well known means, such as a solvent. After this step, the board will have bare copper foil 62*a* except in the circuit areas 80 where plated.

Figure 14:
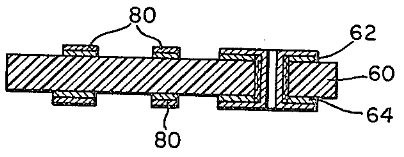
FIG. 14 is a fragmentary sectional view of the printed circuit board after the etching step.

Following removal of the remaining photo-resist 68*a*, the board is immersed in an etching bath to remove the exposed copper 62*a* on the board, leaving the board, as seen in FIG. 14. The result is a metallic reproduction of the circuits and other features desired on both sides of the printed circuit board. The final step is to finish the board to conform to the board profile as first laid out on the grid master.

Figure 15:
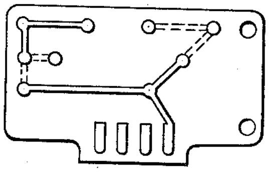
FIG. 15 is a plan view illustrating the completed board.

A complete printed circuit board produced by the method steps described above, and as illustrated in FIG. 15, has exact and precise registration of corresponding pads on both sides of the board. Since the same pad locations were utilized for both sides and only the circuitry was changed to conform to the desired configuration, it is apparent that pad registration will be precise.

In some cases it may be desirable to interconnect the circuits on opposite sides of the board by means other than plated-through holes, as described above, in which case it may be preferred to delay the drilling of the holes until this time. In either case the precise registration afforded by the above-described method insures accuracy of the interconnection.

Printed circuit boards have ben produced by the method described above starting with a grid master negative like that shown in FIG 2, several times the size of the desired final product. Opaque pads and tape circuitry were applied in the desired positions on a film reproduction, or positive, of the grid master negative made on Kodak Photomechanical Film, such as described in Kodak Materials for the Graphic Arts, a publication produced by the Eastman Kodak Company in 1957, and having its grid and other information etched into the surface of the film by a suitable etchant or bleach, a described in Photographic Chemistry by Pierre Glafkides, translated from French by Keith M. Hornsby, Fountain Press, London, 1960, and dyed as described above. A reduction of the layout was obtained in the photo printing step by projection printing, and registration and alignment of the negatives of the two sides of the board were carried out in the manner set forth above.

While any of the well known photographic emulsions may be used, such as described in Modern Photoengraving by Louis Flader and J. S. Mertle, 1948, Modern Photoengraving Publisher, Chicago, Illinois, in this case, Kodak Photographers' Resist was used to coat a pre-prepared phenolic board coated on both sides with 3 mil copper foil. The use of Kodak Photo Resist in the preparation of printed circuit boards is described by Eisler in The Technology of Printed Circuits, 1959, Heywood and Company, Ltd., London. On page 103 of this book a typical composition of Kodak Photo Resist is presented, and on pages 152–155, a typical procedure using Kodak Photo Resist is presented. In the contact printing step, it has been found more advantageous to use ultra violet cold light for exposing the photographic resist, since less heat and dust are generated. Development of the photo-resist is done with conventional process developers and fixers. The plating step, when performed with gold, is done in a $\frac{1}{10}$ normal solution of gold cyanide for 15 minutes at 70° F. When rhodium is the desired plating, rhodium chloride dissolved in dilute hydrochloric acid may be deposited by electro-plating.

The solvent for removing the photo-resist after the plating step is acetone, although other organic solvents such as methylethyl ketone, carbon tetrachloride, or carbon disulphide are also satisfactory. The etching solvent for removing the foil from the unplated portions may be ferric chloride or ammonium persulphate. The etching step has been carried out satisfactorily at room temperatures, although it is preferred to use a bath temperature of from 100 to 120° F., because of the reduction in time required for the etching step to be carried to completion.

The above-detailed description is given by way of example and is not to be construed in a limiting sense, but is to include all known equivalent steps.

In conclusion it must now be clearly evident that the method involves both the new and the old to form a new combination of easy method steps resulting in an inexpensive finished product heretofore difficult and costly to obtain.

What is claimed is:

1. A method of obtaining registration between circuitry on both sides of a printed circuit board comprising the steps of: separately applying opaque pads and removable circuit lines for side one of the printed circuit board on a transparent grid master, photo-projection printing said grid master of side one, developing a negative of side one, removing the circuit lines only for side one, applying new circuit lines for side two utilizing the same pad locations, photo-projection printing said grid master of side two, developing a negative of side two, registering the negatives of sides one and two and punching registration holes through them, forming identically-spaced registration holes through the board, and registering the negatives on opposite sides of said board by aligning similarly positioned registration holes common to each.

2. The method of making photographic models for two-sided printed circuit boards comprising the steps of: providing a transparent grid master of greatly enlarged size as compared to the desired finished printed circuit board, said grid master, in addition to its grid, having an outline of the desired board and opaque areas within and along one edge of the board outline representative of edge contacts; applying opaque pads centered on selected cross-over points of said grid; applying opaque tape to extend between selected of said pads and cooperating therewith to represent the printed circuit for one side of said printed circuit board; photo-projection printing said grid master of side one, developing a first film negative of the so prepared grid master but without the grid lines, said negative being reduced through said photo-projection process to an extent wherein the board outline is equal to the desired size of the finished board; removing only the circuit tape from said grid master; again applying opaque tape to extend between selected of said pads and cooperating therewith to represent the printed circuit for the opposite or second side of said board; photo-projection printing said grid master of side two, developing a second film negative of the so prepared grid master but without the grid lines, said negative also being reduced through said photo-projection process the same amount as said first negative; registering the said first and second negatives with corresponding spots reduced on the negatives registered with each other; simultaneously punching registration holes through both negatives; whereby said negatives may be brought into registry on a printing fixture with opposite photo-sensitized surfaces of a printed circuit board provided with similar registration holes.

3. The method of making two-sided printed circuit boards comprising: providing a blue-line transparent grid master of greatly enlarged size as compared to the desired finished printed circuit board, said grid master, in addition to its blue-line grid, being provided with an outline of the desired board and spots along one edge representative of edge contacts in a photographically reproducable color; applying opaque pads at selected cross-over points of said grid, said pads having a central aperture with crosshairs for registration with the grid intersections when applying the pads; applying opaque tape to extend between selected of said pads and cooperating therewith to represent the printed circuit for one side of said printed circuit board; photo-projection printing said grid master of side one, developing a first negative of the so prepared grid master but without the grid, said first negative being reduced through said photo-projection process to a size wherein the board outline is the same size as the desired size of the finished board; removing only the circuit tape from said grid master; again applying opaque tape to extend between selected of said pads and cooperating therewith to represent the printed circuit for the opposite or second side of said board; photo-projection printing said grid master of side two, developing a second negative of the so prepared grid master but without the grid, said second negative also being reduced through said photo-projection process to a size wherein the board outline is the same size as the desired size of the finished board; registering the said negatives with corresponding spots reproduced from the opaque pads registered with each other; simultaneously punching registration holes through both negatives; registering said negatives on opposed photosensitized surfaces of a printed circuit board by means of said registration holes; and photographically printing said negatives thereon.

4. In a process for preparing close tolerance art work for use in the photographic preparation of printed circuit boards having registered circuitry on opposite sides of said board and utilizing a transparent grid master having a nonphotographically reproducible grid and a photographically reproducible outline of the printed circuit board, board mounting holes and edge contact pads, the improvement comprising applying opaque adhesive pads at selected cross-over points on said grid representative of common circuit connections between the circuitry on each side of the board, applying adhesive opaque tape between said pads to represent the circuitry on one side of said board, photographing said grid to produce a photo-negative of said one side of said board, removing said tapes only, applying opaque tape between said pads to represent different circuitry on the other side of said board, and photographing said grid to produce a photo-negative of said other side of said board, wherein said pads common to both photo-negatives provide points for registering the circuitry of said opposite sides.

References Cited in the file of this patent

UNITED STATES PATENTS

| | | |
|---|---|---|
| 1,224,328 | Scritsmier | May 1, 1917 |
| 1,736,445 | Jannenga et al. | Nov. 19, 1929 |
| 2,383,567 | Rudnick | Aug. 28, 1945 |
| 2,610,413 | Dasey | Sept. 16, 1952 |
| 2,942,973 | Patrick | June 28, 1960 |
| 2,958,928 | Bain et al. | Nov. 8, 1960 |
| 2,972,533 | Frankau et al. | Feb. 21, 1961 |

OTHER REFERENCES

Barrows et al.: Electronics, April 7, 1961, pp. 102, 104 and 105.

Eisler: The Technology of Printed Circuits; 1959, Heywood and Company Ltd., London, pages 111–131.

Swiggett: Intro to Printed Circuits, 1956, John F. Reder Publisher, Inc., N.Y., pp. 28–42.